United States Patent [19]

Buck et al.

[11] Patent Number: 4,525,699

[45] Date of Patent: Jun. 25, 1985

[54] ELECTRONIC MONITORING SYSTEM WITH MALFUNCTION INDICATOR

[75] Inventors: Robert Buck, Neukirch; Michael B. Friedrich, Kressbronn; Hans D. Gesthuysen, Essen-Kettwig; Gerd Marhofer, Essen-Bredeney, all of Fed. Rep. of Germany

[73] Assignee: i f m electronic GmbH, Essen, Fed. Rep. of Germany

[21] Appl. No.: 467,853

[22] Filed: Feb. 17, 1983

[30] Foreign Application Priority Data

Feb. 18, 1982 [DE] Fed. Rep. of Germany ....... 3205737

[51] Int. Cl.³ .............................................. G08B 29/00
[52] U.S. Cl. .................................... 340/512; 340/514; 340/561
[58] Field of Search .............................. 340/512–514, 340/500, 506, 509, 515, 516, 561

[56] References Cited

U.S. PATENT DOCUMENTS

| 3,566,399 | 2/1971 | Weld | 340/512 |
| 3,934,237 | 1/1976 | Gysell et al. | 340/512 |
| 4,070,669 | 1/1978 | Gautier | 340/512 |

Primary Examiner—Donnie L. Crosland
Attorney, Agent, or Firm—Karl F. Ross; Herbert Dubno

[57] ABSTRACT

A contactless motion detector, specifically an oscillator whose signal amplitude is attenuated or enhanced by the approach of a monitored metallic element, is periodically switched for brief periods into its alternate state by a train of short test pulses giving rise to corresponding checking pulses that are superimposed upon the integrated output voltage of the oscillator whereby that voltage is intermittently increased when at low level and/or intermittently reduced when at high level. These checking pulses, whether of the voltage-increasing or the voltage-reducing kind, are integrated to provide an enabling signal allowing a controlled load to be energized or de-energized according to the mean value of the output voltage; an absence of the enabling signal indicates a malfunction.

11 Claims, 20 Drawing Figures

ELECTRONIC MONITORING SYSTEM WITH MALFUNCTION INDICATOR

FIELD OF THE INVENTION

Our present invention relates to an electronic monitoring system, of the type including a contactless motion detector or the like which is sensitive to an ambient condition for generating on an output lead a binary load-control signal assuming a predetermined value in response to a significant change in that condition, and more particularly to a malfunction indicator associated with such a system.

BACKGROUND OF THE INVENTION

Monitoring systems of this type have been described, for example, in U.S. Pat. No. 4,193,023 issued in the names of two of us, Robert Buck and Gerd Marhofer, and in various earlier patents cited therein. A system of this nature usually includes an electronic switch, such as a thyristor, which is triggered to energize a load for signaling the occurrence of the event to be monitored. The trigger signal may be derived from the output of an oscillator whose amplitude changes, e.g. in response to the approach of a ferromagnetic element, as a result of such occurrence.

U.S. Pat. No. 4,135,124, in the name of Robert Buck, discloses the use of an Exclusive-OR gate as a means for enabling the selective emission of a high or a low output signal upon an increase or a decrease of the oscillator voltage whereby an electronic switch such as a thyristor will fire when the element being monitored either approaches or departs from the vicinity of the motion detector; with its anode tied to a supply of raw-rectified alternating voltage, the thyristor is continuously retriggered in the presence of a high voltage at the output of the Ex-OR gate so as to draw an increased load current. The Ex-OR gate, therefore, acts as a selective inverter for the control signal emitted by the motion detector.

Since the load current in such a system is either "on" or "off", depending on the conductive or nonconductive state of the electronic switch, a malfunction resulting in a prolonged absence of such load current may go undiscovered by being wrongly interpreted as either the occurrence or the nonoccurrence of the event to be detected. It is therefore desirable to provide means in a system of this nature for indicating the existence of a malfunction to an operator. For this purpose it has already been proposed to provide the system with two outputs carrying antivalent signals so that either one or the other output will conduct in any event. Under some circumstances, however, a malfunction could disable the detector while still keeping one of these outputs energized.

In copending application Ser. No. 415,442 filed Sept. 7, 1982 by three of us, namely Robert Buck, Gerd Marhofer and Hans-Dieter Gesthuysen, there has been disclosed an improved malfunction indicator in a monitoring system of this character which more or less excludes the possibility that a failure of the detector or a breakdown in its output circuit be overlooked. According to that disclosure, the system comprises a source of a train of recurrent pulses along with modulating means connected to that source and to an output lead of the associated detector for shifting the phase of these pulses whenever the binary load-control signal present on that lead assumes a certain value, the modulating means being connected to supervisory means for emitting an alarm indication in response to a malfunction-induced interruption of the pulse train emitted by the source.

Since the pulse train—whether phase-shifted or not—will always reach the supervisory means during normal operation, its absence will be a sure sign that a malfunction has occurred. The supervisory means may include for this purpose a pulse integrator generating a finite test signal during normal operation.

While the pulse train could be phase-modulated in various ways to indicate the occurrence or nonoccurrence of the condition monitored, e.g. the approach or departure of a ferromagnetic element in a machine tool or the like, the preferred design of the modulating means is in the form of an anticoincidence gate of the Exclusive-OR type which, in acting as a selective inverter as known per se from the aforementioned U.S. Pat. No. 4,135,124, transmits the incoming pulses with or without phase inversion. When the pulse source is a square-wave generator with a duty ratio of substantially 50%, the magnitude of the test signal emitted by the aforementioned pulse integrator will remain virtually unchanged in the event of a phase reversal.

As further described in that copending application, the pulse train issuing from the anticoincidence gate is fed—preferably after amplification—to a comparator in the form of a second Exclusive-OR gate forming part of the supervisory means. Another input of this second Ex-OR gate receives a reference wave from the pulse generator so that the two pulse trains appearing at that gate are either in phase or in phase opposition, depending on the output signal of the detector. The output voltage of the second Ex-OR gate will be very low (theoretically zero) in the case of cophasal pulses but will be relatively high in the presence of antiphasal pulses; this voltage, therefore, can serve as a useful d-c signal turning a load on and off. If, however, a malfunction interrupts the pulse train coming from the first Ex-OR gate, this output voltage will be intermittent and therefore of reduced but non-zero average amplitude; the simultaneous disappearance of the test signal will further indicate the off-normal condition.

While the malfunction indicator of the copending application operates satisfactorily in checking on the overall integrity of the monitoring system, it does not specifically verify the correct functioning of the motion detector proper, such as the aforementioned oscillator.

OBJECT OF THE INVENTION

The object of our present invention, therefore, is to provide means in such a monitoring system for further improving its malfunction indicator to make it sensitive to defects occurring in the motion detector itself or in the externnal connections thereof.

SUMMARY OF THE INVENTION

In accordance with our present invention, a source of periodically recurring test pulses is connected to a control input of a detector sensitive to an ambient condition, as defined above, for giving rise to a corresponding train of checking pulses that are superimposed upon and modulate a two-level useful signal appearing in the detector output in dependence upon the ambient condition being monitored. The detector output is coupled to supervisory means for deriving a load-control signal purged of checking pulses from the useful signal, the supervisory means including pulse-responsive means for emitting an alarm condition upon sensing a malfunction-induced interruption of the train of checking pulses. This alarm indication could be a visual or audible signal, for example, and/or an inhibition of a switchover of a load normally occurring with a change in the useful signal, e.g. the actuation or release of a relay.

Advantageously, but not necessarily, the test pulses to be applied to the control input of the detector are of two types respectively generated when the useful signal is at its lower and at its higher level, with the result that amplitude-increasing checking pulses are superimposed upon the useful signal when the latter is at its lower level whereas checking pulses of an amplitude-reducing kind appear at the higher signal level. In some instances, however, it will be sufficient to generate the checking pulses when the useful signal is at one of these two levels, namely that which is considered critical for the control of the associated load (e.g. for setting a machining tool in motion when a workpiece arrives at a particular location).

When, as is usually the case and as will be assumed hereinafter, the detector is an oscillator with a tank circuit tuned to an operating frequency which is suppressed in an integrating stage ahead of its output, that operating frequency should be substantially higher than the recurrence rate or cadence of the test pulses in order to prevent a suppression of the resulting checking pulses. On the other hand, the checking pulses ought to eliminated before the useful signal modulated thereby is fed to switchover meanns controlling the associated load. The conversion of the pulse-modulated useful signal into a continuous load-control signal can be achieved by integration in a circuit such as an RC network having a time constant considerably larger than that of the integrating stage at the oscillator output. In such a case, however, care must be taken to insure that the load-control signal—which of course is proportional to the mean amplitude of the pulse-modulated useful signal—still varies between distinct values respectively corresponding to the lower and the upper level of the useful signal. This means that the amplitudes and recurrence rates of the checking pulses are to be low enough to keep the mean signal amplitudes well separated from each other. To this end we prefer to make the recurrence period of the test pulses substantially greater than twice their width, i.e. to provide them with a duty ratio well below 50%.

Another possibility of eliminating the superimposed checking pulses is to provide an Exclusive-OR gate, upstream of the switchover means, with one input connected to the detector output and with another input connected to the source of test pulses. Such a circuit arrangement affords greater freedom in the choice of pulse widths and cadences.

For an automatic changeover from one type of test pulses to the other, in the event of a response of the detector to an ambient condition modifying its signal level, the source of test pulses may have an input coupled to the detector output, either directly or by way of the load-controlling switchover means. When the oscillator is externally damped so as to operate at a low output level, the test pulses should have an undamping effect to enhance the amplitude of the generated oscillations. Conversely, the test pulses should have a damping effect to attenuate these amplitudes when the oscillator is externally undamped. Thus, the oscillator may be provided with switch means controlled by the test pulses for varying the Q of its tank circuit, as by selectively inserting and disconnecting one or more resistances in series and/or parallel with the circuit reactances.

As more fully described hereinafter, the pulse-responsive means may comprise a pulse extractor but could also be represented by threshold circuitry ascertaining the mean value of the useful signal.

BRIEF DESCRIPTION OF THE DRAWING

The above and other features of our invention will now be described in detail with reference to the accompanying drawing in which.

SPECIFIC DESCRIPTION

Figure 1:
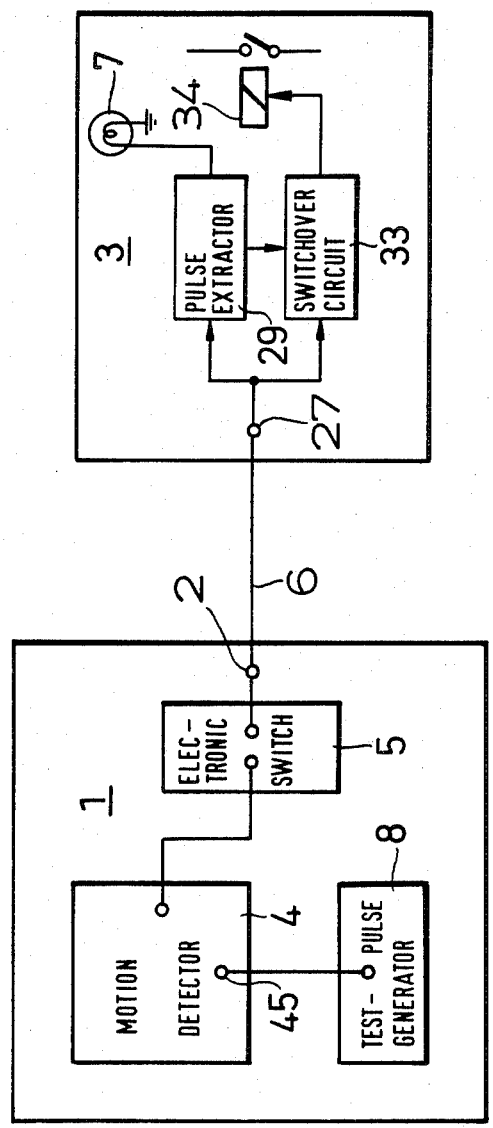
FIG. 1 is an overall block diagram of an electronic monitoring system according to our invention.

As illustrated in FIG. 1, an electronic monitoring system according to our invention comprises a modular unit 1, operating as a contactless position sensor, and a supervisory unit 3 for the control of a load not shown. Position sensor 1 includes a motion detector 4, specifically an oscillator responsive to the approach of an external metallic element whose proximity is assumed to have a damping effect resulting in a lowering of its signal amplitude as is well known per se. In principle, of course, the proximity of such an element could also have an undamping effect increasing the signal amplitude. In either case, moreover, the load may be actuated upon a lowering or a raising of the level of the output signal fed from motion detector 4 to an electronic switch 5 which operates with sufficient hysteresis to integrate the emitted oscillations in a useful signal appearing on its output terminal 2. The latter, via a line 6, is connected to an input terminal 27 of supervisory unit 3 which is shown to include a relay 34 (of the electromagnetic or the electronic type) controlling the load proper. Unit 3 further includes a pulse extractor 29 and a switchover circuit 33, both connected to terminal 27, for the selective actuation of relay 34. Extractor 29 is responsive to checking pulses, superimposed upon the output signal of motion detector 4, which result from the application of a series of periodic test pulses to a control input 45 of detector 4 by a generator 8. If these checking pulses are absent, at least when the useful signal is at a level designated to operate the relay 34, extractor 29 inhibits the operation of the relay. The extractor may also light an alarm lamp 7 upon discovering the absence of such checking pulses on either of the two levels of the useful signal; such absence may be due to a malfunction of pulse generator 8 or of motion detector 4 and could also be caused by a defect in an associated conductor.

Figure 2:
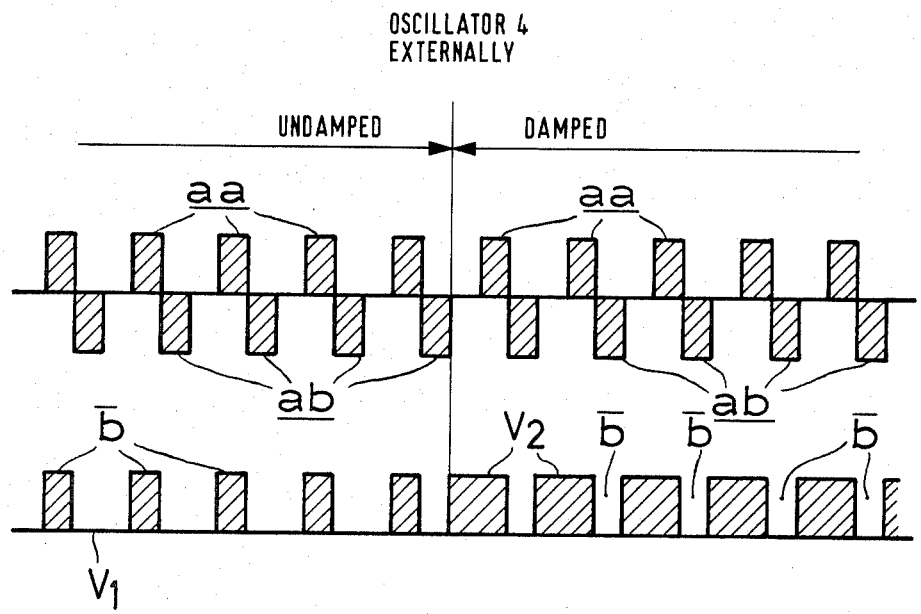
FIGS. 2 and 3 are graphs illustrating the effect of test pulses upon the output signal of a motion detector forming part of the system of FIG. 1.
Figure 3:
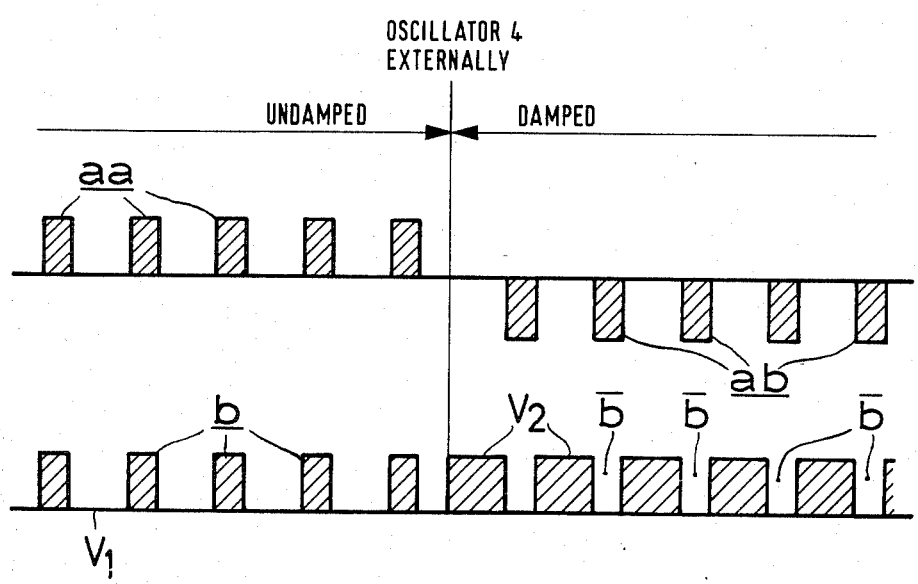

FIG. 2 shows in its upper graph two types of test pulses aa and ab, of opposite polarities, and in its lower graph a train of checking pulses b or b̄ respectively resulting therefrom. The integrating stage of the oscillator is assumed to include an inverter which translates the high-amplitude oscillations into a useful signal in the form of a low-level voltage $V_1$ and the low-amplitude oscillations into a useful signal in the form of a high-level voltage $V_2$. It is further assumed that the positive test pulses aa have a damping effect raising the voltage level of the useful signal while the negative test pulses ab have an undamping effect lowering that voltage level. When the useful signal is at its lower level $V_1$, as indicated in the left-hand half of FIG. 2, pulses ab will not cause a significant further reduction of that voltage but pulses aa will increase it to produce the checking pulses b. Analogously, when the useful signal is at its higher level $V_2$ as indicated in the right-hand half of FIG. 2, test pulses aa will be ineffectual but test pulses ab will produce the voltage-reducing checking pulses b̄. We may therefore omit the negative test pulses ab when the oscillator is externally undamped, as illustrated in the left-hand half of FIG. 3, and may also omit the positive test pulses aa in the externally damped condition, as illustrated in the right-hand half of FIG. 3; it will be noted that the configuration of the pulse-modulated useful signal on basic level $V_1$ or $V_2$ is not changed by this omission. FIGS. 2 and 3 further show that the recurrence period of the test pulses, and thus also of the corresponding checking pulses, is substantially three times their width.

Figure 4:
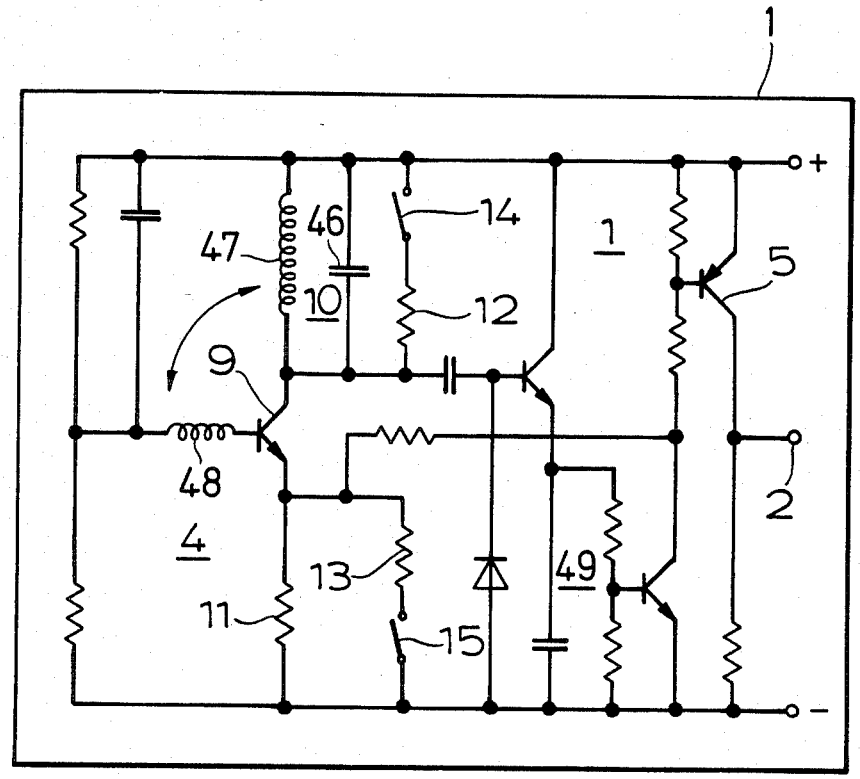
FIG. 4 is an elementary circuit diagram of such a motion detector essentially consisting of an oscillator.

FIG. 4 shows details of modular unit 1, except for the associated test-pulse generator 8 (FIG. 1) which need not be part of that unit but may constitute an external component that could be common to a group of position sensors operating in parallel. Oscillator 4 is seen to comprise an NPN transistor 9 whose collector is connected to positive potential via an LC network 10 which forms part of the tank circuit of that oscillator and includes a capacitor 46 in parallel with a coil 47, the latter being inductively coupled with a feedback coil 48 connected to the base of transistor 9. The emitter of this transistor is connected to negative potential by way of a resistor 11 across which its output signal is generated. A damping resistor 2 is selectively connectable, via an electronic switch 14, across LC network 10 to lower the Q of the tank circuit. Conversely, an undamping resistor 13 is selectively connectable by an electronic switch 15 across emitter resistor 11 to reduce the effective resistance in series with network 10. Switches 14 and 15 are respectively closable, in a manner more fully described hereinafter, by pulses aa and ab of FIG. 3. Output switch 5 of FIG. 1 is represented by a PNP transistor in the last stage of a three-stage amplifier including an RC network 49 whose time constant exceeds the period of the operating frequency of oscillator 4 but is significantly less than the width of test pulses aa, ab in order to give rise to the checking pulses b or b̄ (cf. FIGS. 2 and 3) in the useful signal appearing on output terminal 2.

Figure 5:
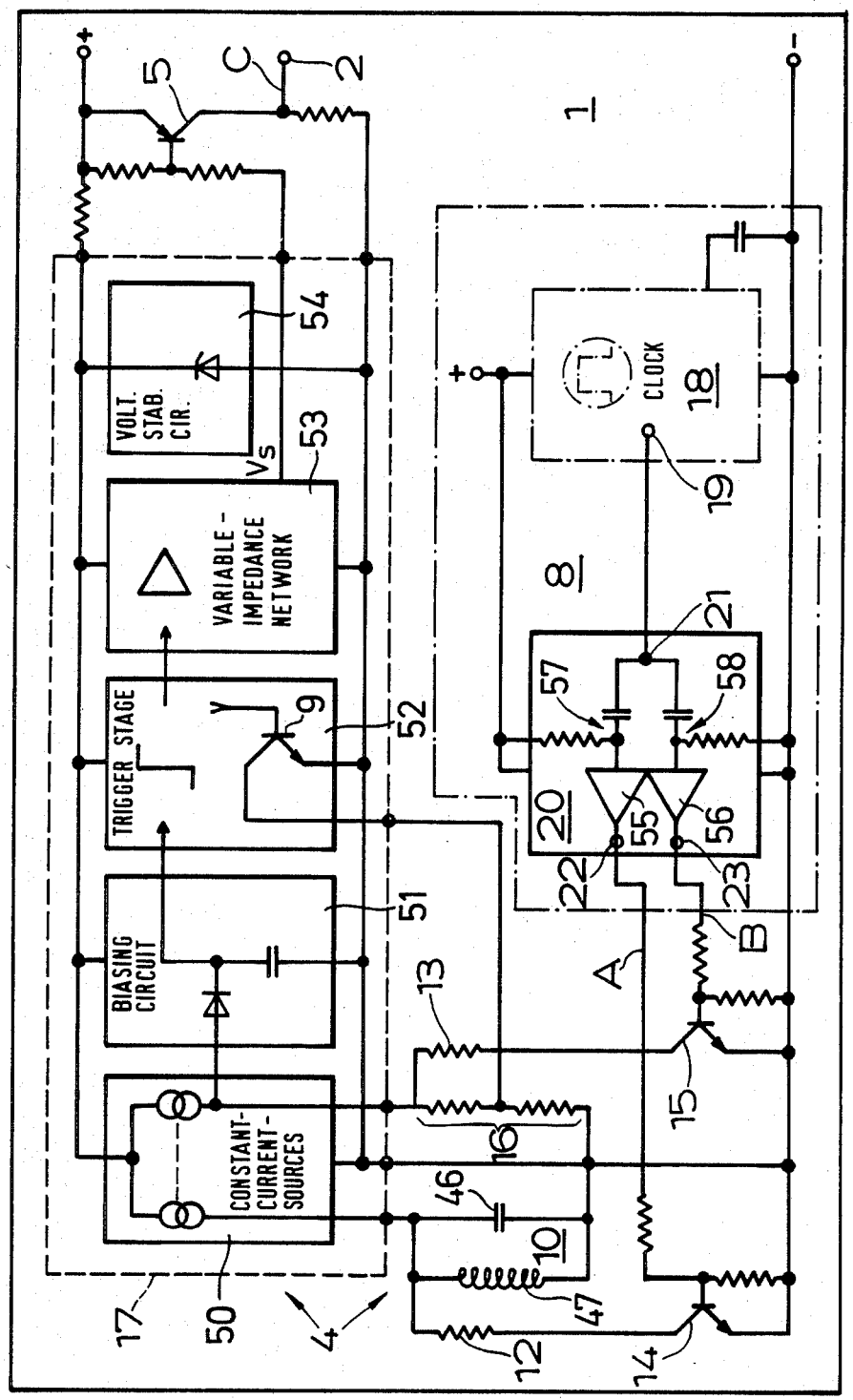
FIG. 5 is a more detailed circuit diagram of such an oscillator and of an associated test-pulse generator in a position sensor represented by one of the blocks of FIG. 1.

A minor drawback of the circuit arrangement of FIG. 4 resides in the fact that the two electronic switches 14 and 15 are connected to potentials of opposite polarities. This drawback has been obviated in a modified circuit arrangement shown in FIG. 5 where switches 14 and 15 are illustrated as NPN transistors with emitters connected in parallel to the negative supply conductor (which may be grounded). FIG. 5 further shows, rather diagrammatically, a monolithically integrated component 17 with several cascaded sections generally corresponding to those shown in the two above-identified prior patents, including a group of constant-current sources 50, a biasing circuit 51, a trigger stage 52 with oscillation-generating transistor 9, a variable-impedance network 53 with a binary electronic switch such as a transistor, thyristor or triac, and a voltage-stabilizing circuit 54 symbolized by a Zener diode. The emitter of transistor 9 is here connected directly to negative potential while its collector is connected to positive potential via part of a balancing or hysteresis-controlling resistance network 16 and a constant-current source in stage 50; another such source supplies direct current from the positive supply lead to LC network 10. The regenerative coupling between network 10 and the base of transistor 9, including the coil 48 of FIG. 4, has not been illustrated.

Also shown in FIG. 5 is the test-pulse generator 8 comprising a clock circuit 18 emitting timing pulses, of the recurrence rate and width of pulses aa and ab (FIGS. 2 and 3), on an output terminal 19. The latter is connected to an input terminal 21 of a converter stage 20 in which the timing pulses pass in parallel to a pair of gates 55 and 56 by way of respective differentiation circuits 57 and 58. Gate 55 responds to positive-going flanks of the incoming timing pulses to emit, on an output terminal 22, a pulse train A corresponding to the positive test pulses aa of FIG. 2; gate 56, which is of inverting character, responds to the negative-going flanks of the timing pulses to emit, on an output terminal 23, another train B of positive pulses which are offset by one pulse width from pulses A and can be regarded as an inversion ab̄ of the test pulses ab of FIG. 2. The two gates have thresholds establishing the requisite pulse width together with the time constants of circuits 57, 58. Pulses A go to the base of switching transistor 14 for periodically inserting the oscillation-attenuating resistor 12 in parallel with LC network 10. Pulses B go to the base of switching transistor 15 for periodically inserting the oscillation-enhancing resistor 13 in parallel with resistors 16.

Figure 16:
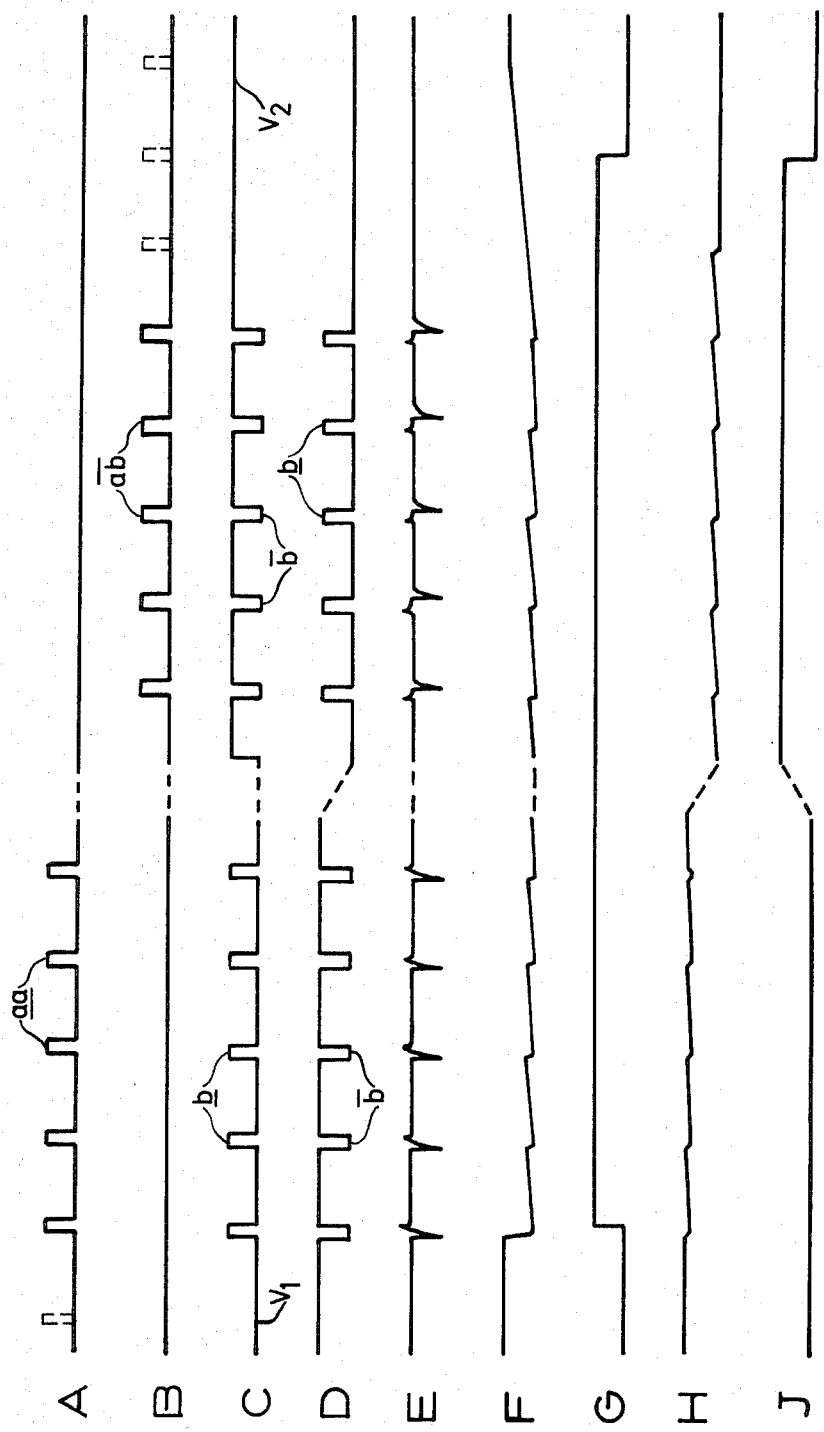
FIG. 16 is a set of graphs pertaining to the operation of a system according to our invention including the units of FIGS. 5 and 14 as modified by FIG. 6.
Figure 17:
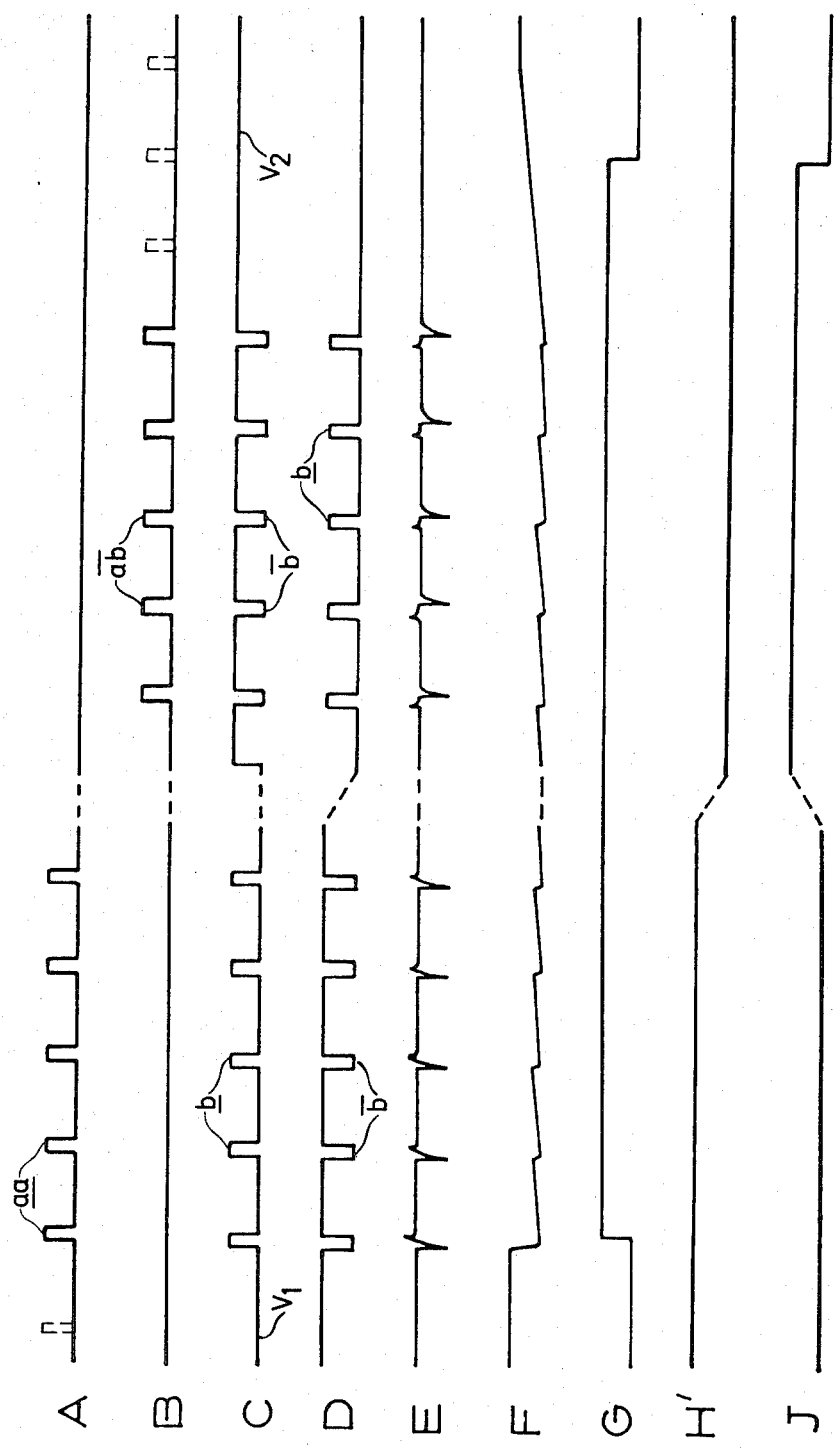
FIG. 17 is a set of graphs similar to that of FIG. 16 but relating to the operation of a system incorporating the units of FIGS. 5, 6 and 15.

As discussed in connection with FIG. 2, the closure of switch 14 is ineffectual when the oscillator 4 is damped by the monitored external element whereas the closure of switch 15 does not significantly alter the output signal of the oscillator in its externally undamped condition. Since pulse trains A and B are relatively staggered, these switch closures do not occur simultaneously and their effects consequently do not cancel each other. The useful signal appearing on the output terminal 2, indicated at C, will then have the configuration shown in the bottom graph of FIG. 2. Reference may also be made to FIGS. 16 and 17 showing signals A, B and C on graphs correspondingly labeled.

With the arrangement of FIG. 5 it is immaterial whether converter stage 20 is part of unit 1 or, along with clock 18, is separate therefrom so as to serve a plurality of such units. We may, however, suppress pulse train A in the externally undamped condition and pulse train B in the damped condition in which test pulses aa and ab are respectively useless as described with reference to FIG. 3. This possibility, taken into account in FIGS. 16 and 17, has been illustrated in FIG. 6 where a modified generator 8' is shown to comprise a converter 20' in which gates 55, 56 with their associated differentiation circuits 57 and 58 are replaced by two AND gates 55' and 56' working into output terminals 22 and 23, respectively, terminal 21 being connected in parallel to respective inputs of these AND gates. A load-control signal J, available at the output of switchover circuit 33 as more fully described hereinafter with reference to FIGS. 14–17, is fed via a control terminal 24 and an integrating amplifier 59 to other inputs of gates 55' and 56', the first of these inputs being inverting. Thus, timing pulses from clock 18 (which still could be common to several position sensors) are transmitted through gate 55' only when signal J is low, as will be the case in the undamped condition of the oscillator, and will pass gate 56' only when that signal is high, namely in the damped condition. As a result, the pulse train A serving for the periodic closure of electronic switch 14 (FIG. 5) is present only when oscillator 4 is not externally damped, thereby generating the amplitude-increasing pulses b of FIG. 3, whereas pulse train B will be emitted at terminal 23 in the opposite situation, giving rise to the amplitude-decreasing pulses b̄. Converter 20' must be individual to the position sensor whose oscillator it controls.

Figure 6:
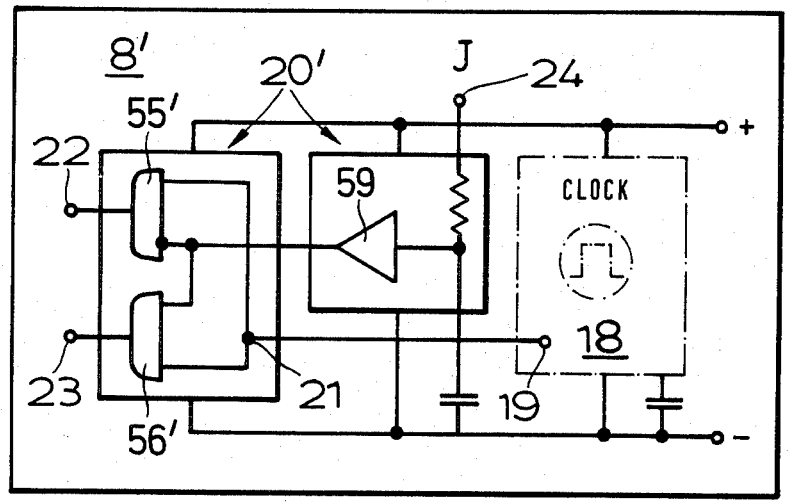
FIG. 6 is a diagram showing a modification of the test-pulse generator of FIG. 5.
Figure 7:
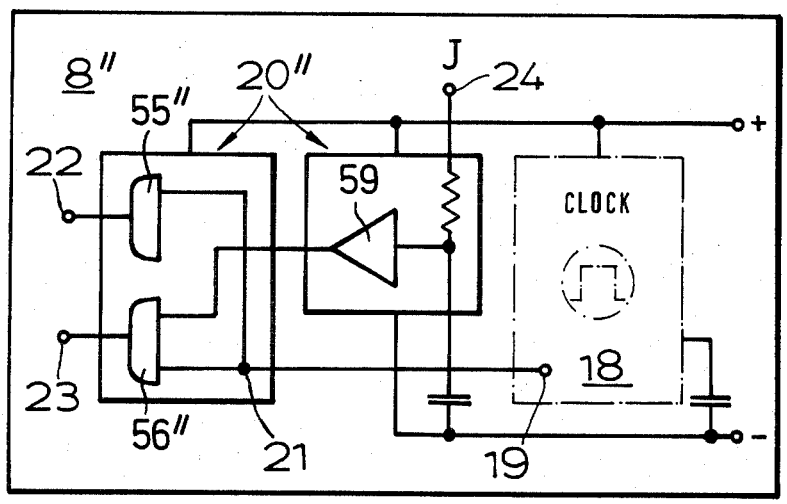
FIG. 7 is a circuit diagram similar to that of FIG. 6, illustrating another modification.

FIG. 7 shows another modified test-pulse generator 8" whose converter 20" is similar to stage 20' of FIG. 6, with the difference that an AND gate 55" working into output terminal 22 has its second input permanently energized to convert all the timing pulses from clock 18 into test pulses aa whereas its companion gate 56" energizes terminal 23 only in the externally damped condition of the oscillator, the same as in FIG. 6. Since in this instance pulses aa and ab coincide in the latter condition, the effect of closure of switch 15 will have to override that of closure of switch 14 in order to provide the desired oscillation enhancement.

FIGS. 8–13, in which the test-pulse generator has been omitted, show various ways of including the Q-modifying resistors 12, 13 and their associated switching transistors 14, 15 in the tank circuit of oscillator 4.

Figure 8:
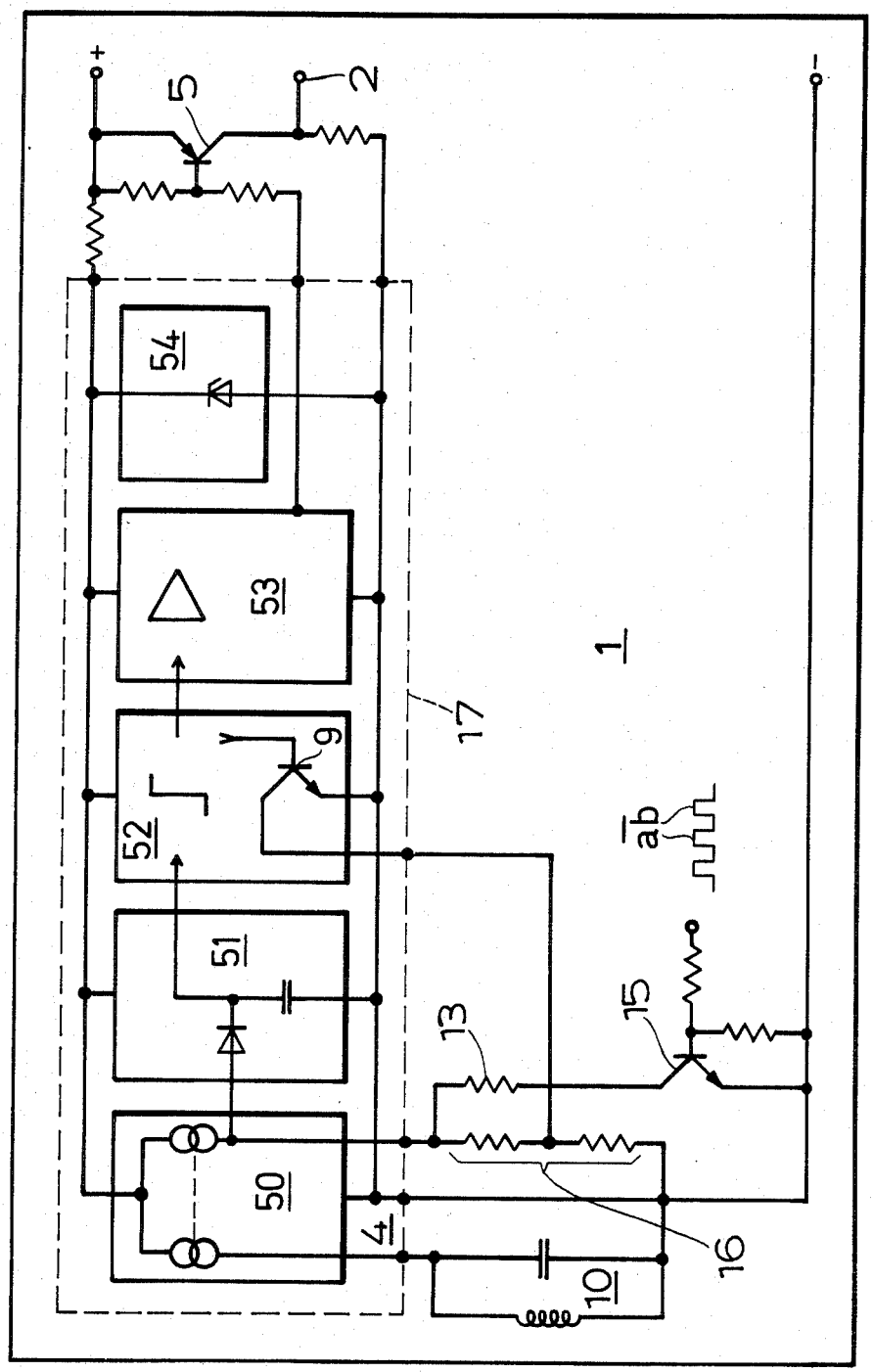
FIGS. 8–13 are circuit diagrams showing further modifications of the oscillator of FIG. 5.
Figure 9:
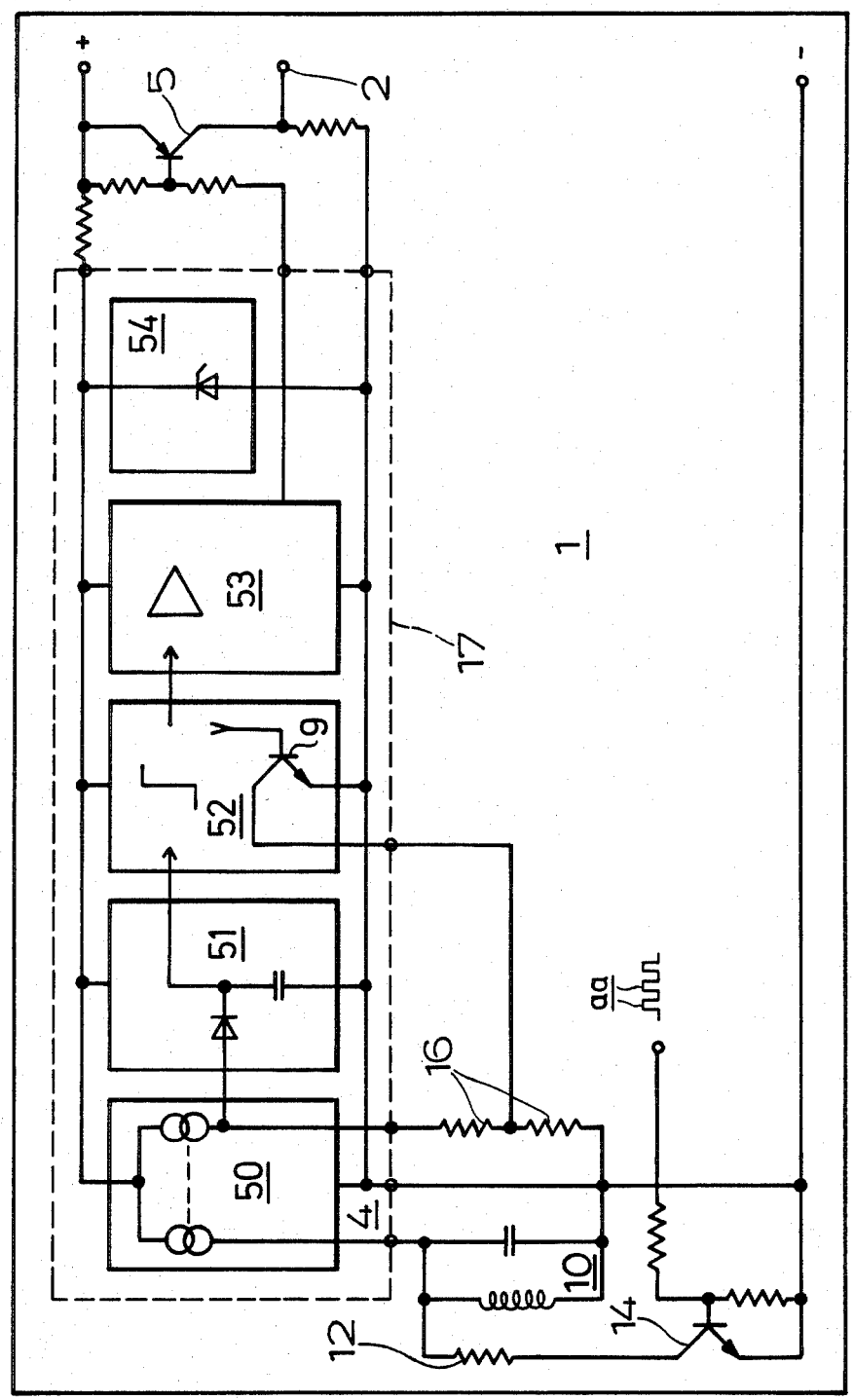

In FIG. 8, transistor 15 and resistor 13 are connected in the same way as in FIG. 5 to shunt the resistors 16 in the presence of inverted test pulses ab̄; resistor 12 and transistor 14, omitted in this Figure, could have a mode of connection different from that of FIG. 5. Similarly, FIG. 9 shows transistor 14 and resistor 12 connected as in FIG. 5, for switching by test pulses aa, while the mode of connection of transistor 15 and resistor 13 could be different.

Figure 10:
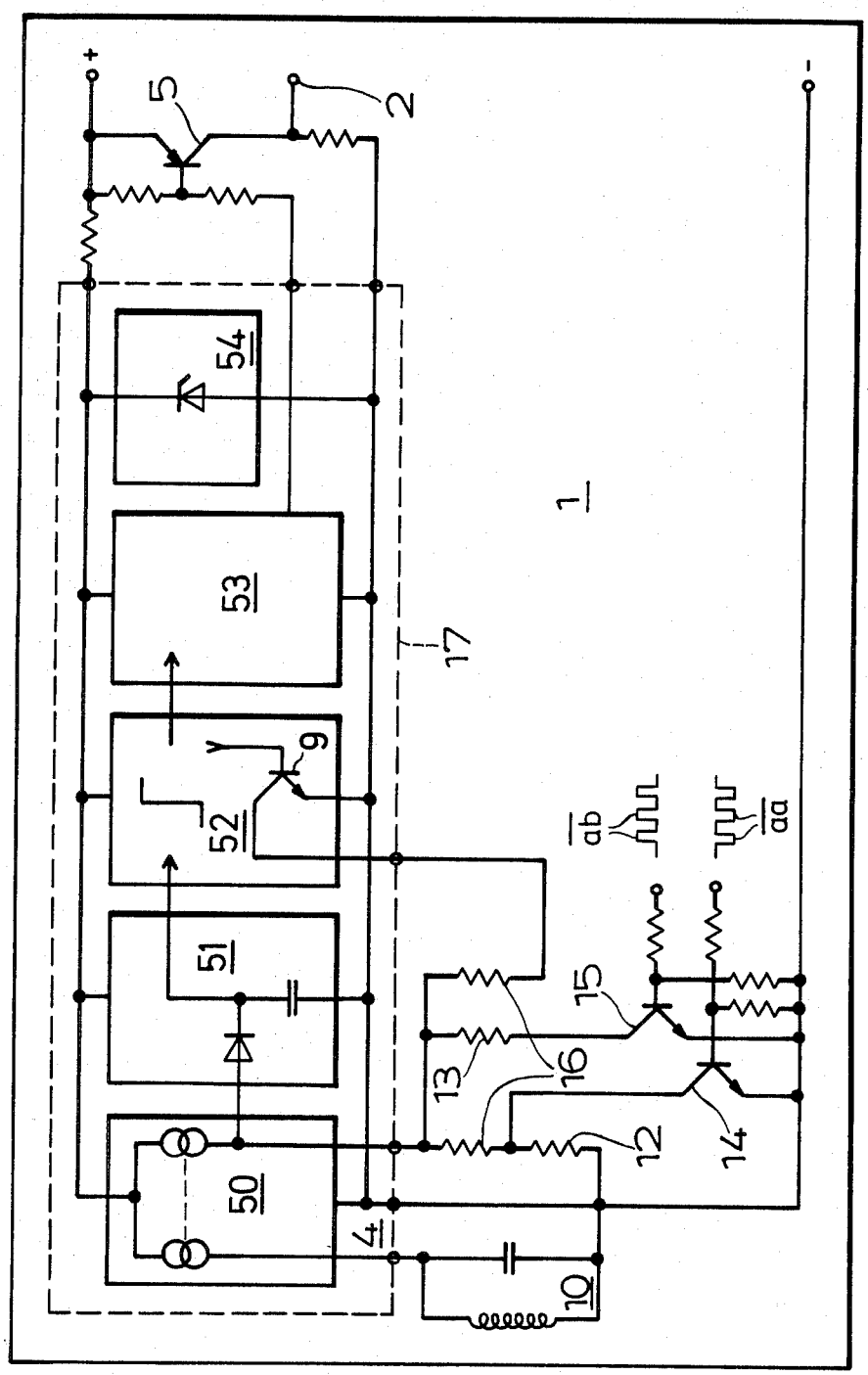

According to FIG. 10, resistors 12 and 13 are both selectively insertable in the resistance network 16, the former in a series branch and the latter in a parallel branch thereof. Resistor 12 becomes effective as an oscillation-attenuating impedance when its normally conductive switching transistor 14 is cut off by an inverted pulse aā to remove the short circuit thereacross; resistor 13 acts as an oscillation enhancer when its switching transistor 15 is turned on by an inverted pulse ab̄ as in FIGS. 5 and 8.

Figure 11:
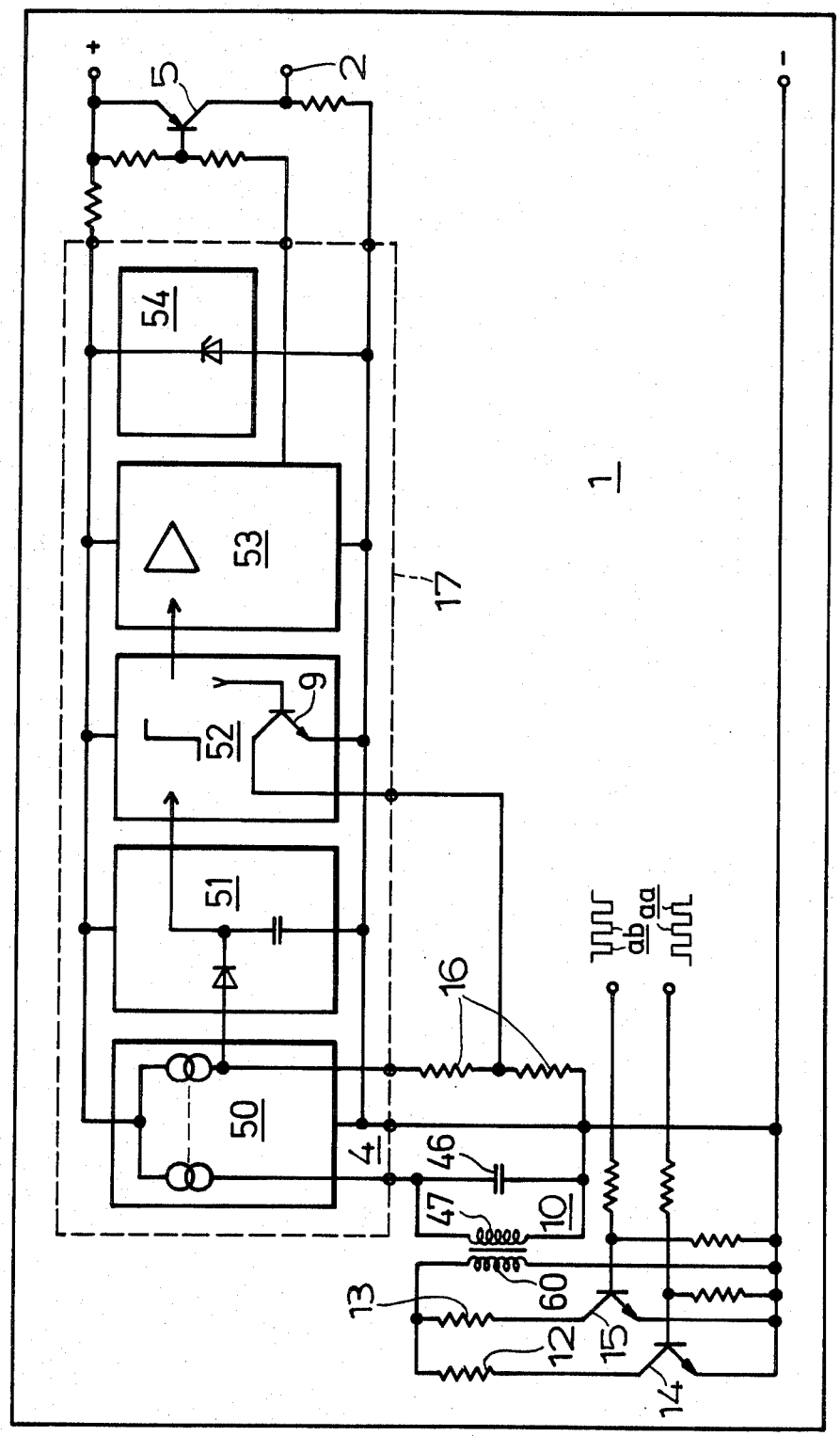

FIG. 11 shows a coil 60 inductively coupled with coil 47 so as to be effectively part of LC network 10. Resistors 12 and 13 lie both in series with coil 60 and thus effectively in shunt with reactances 46, 47. With transistor 15 normally conducting, the shunt conductance represented by resistor 13 is magnified when transistor 14 is cut in by a pulse aa, thereby intensifying the damping effect, but is eliminated when transistor 15 is cut off by a reinverted pulse ab to minimize damping.

Figure 12:
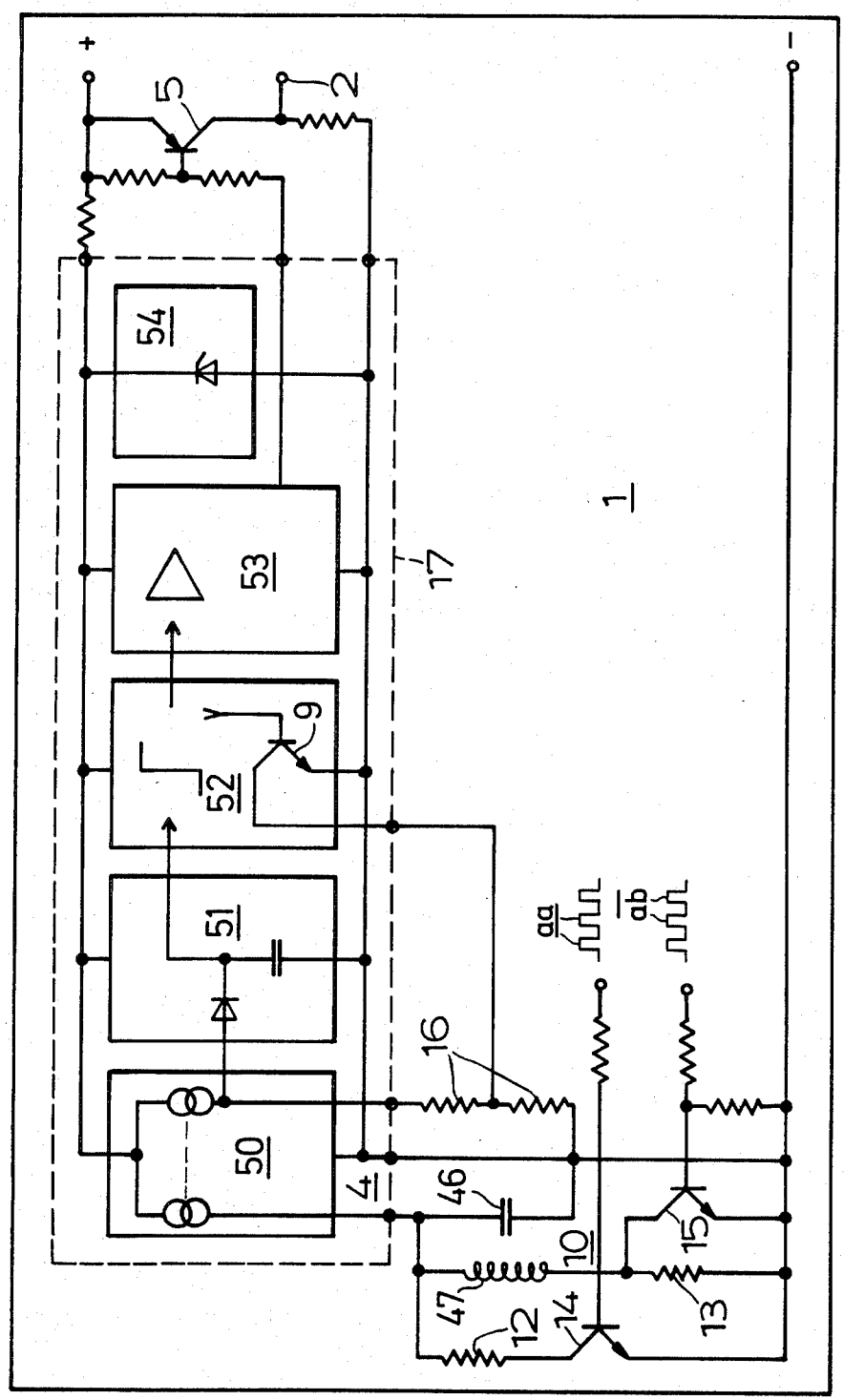

FIG. 12 illustrates the possibility of connecting resistor 12 in shunt and resistor 13 in series with the inductive branch 47 of network 10. Resistor 12, normally disconnected, becomes effective when transistor 14 is turned on by a pulse aa; the damping effect of resistor 13 is eliminated when it is short-circuited by a pulse ab̄ rendering transistor 15 conductive.

Figure 13:
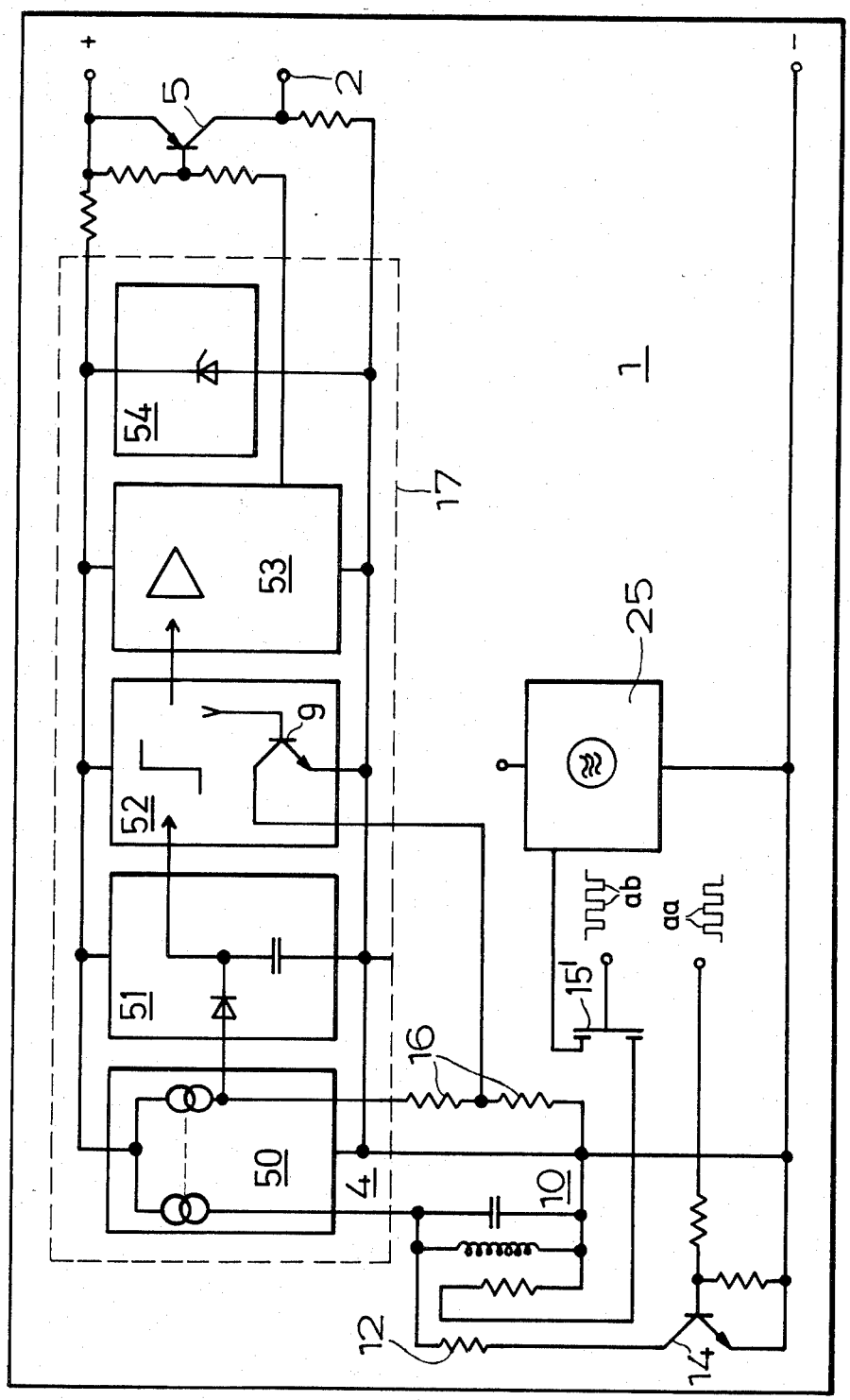

FIG. 13, where resistor 12 and transistor 14 operate as in FIGS. 5 and 9, resistor 13 and transistor 15 have been replaced by a high-frequency oscillator 25 and a field-effect transistor 15' connected in series with an ancillary coil 60' which, like coil 60 of FIG. 11, is electromagnetically coupled with inductance 47 of network 10. When FET 15' is rendered conductive by a pulse ab (or its inversion ab̄, depending on its structure), oscillator 25—whose operating spectrum includes the tuning frequency of the tank circuit of oscillator 4 or a harmonic thereof—injects oscillation-enhancing wave energy into network 10. This mode of undamping could, of course, also be used together with other ways of inserting the damping resistor 12 in the tank circuit.

Figure 14:
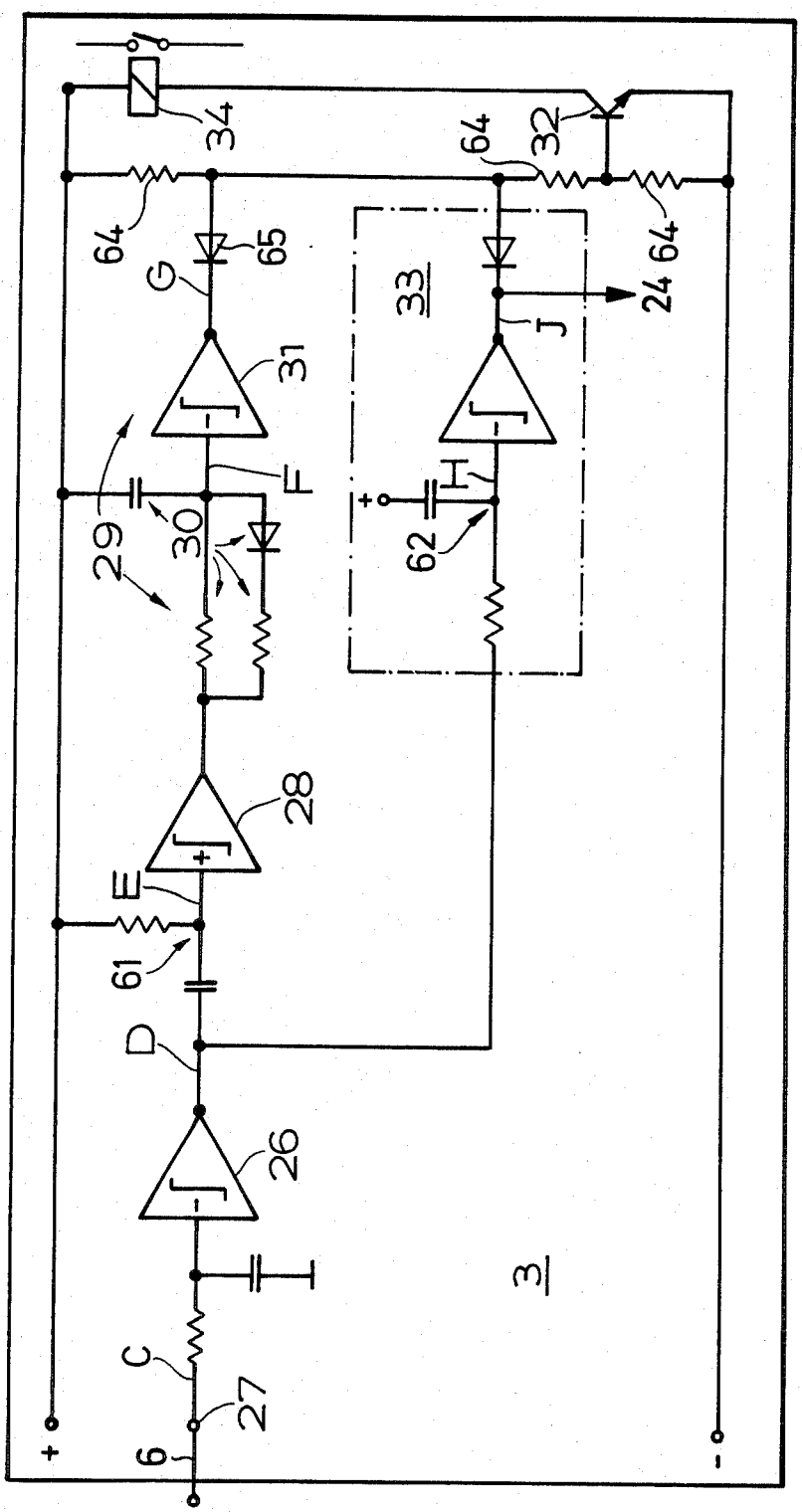
FIG. 14 shows details of a supervisory unit also represented by one of the blocks of FIG. 1.
Figure 15:
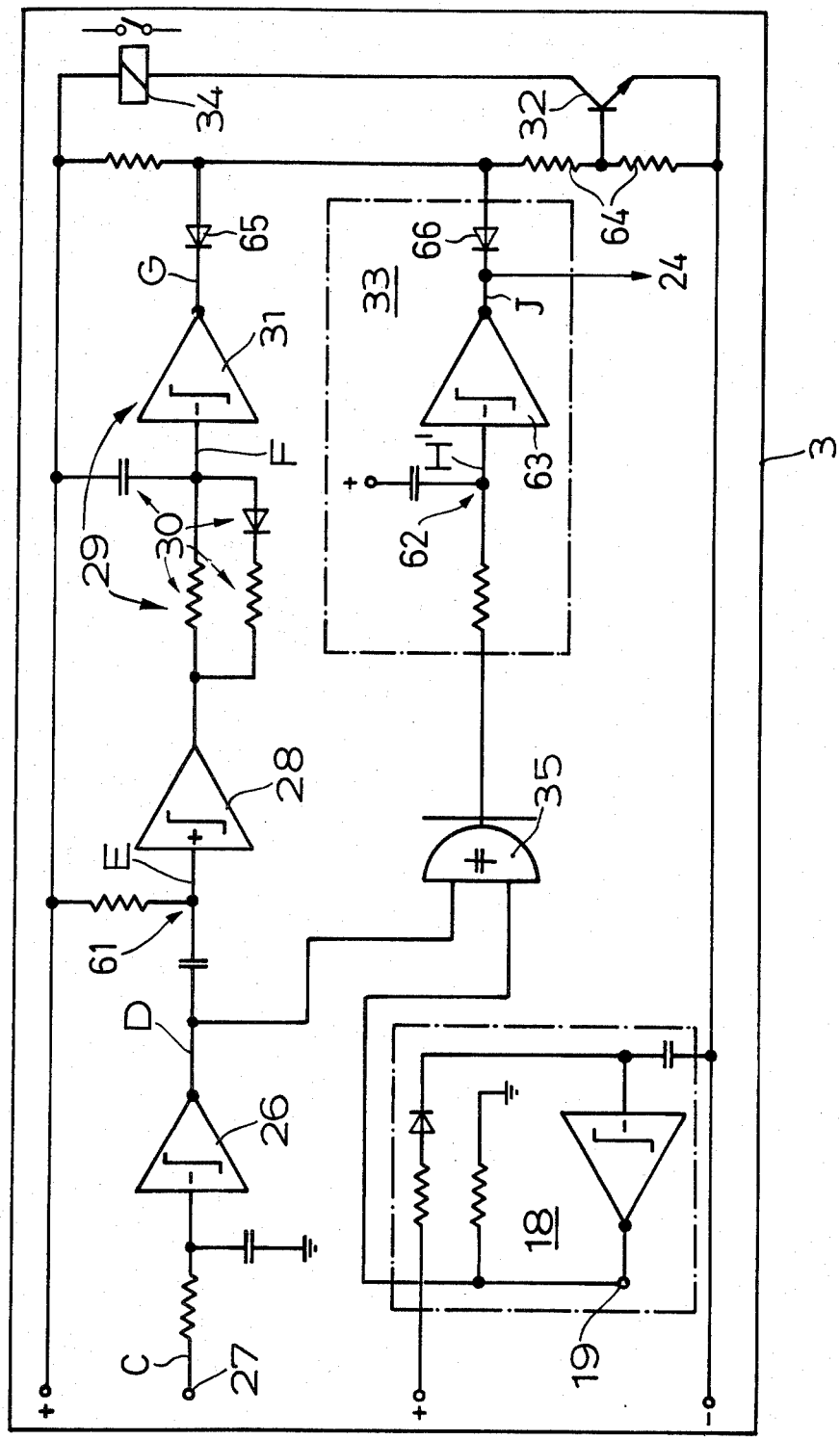
FIG. 15 is a diagram similar to that of FIG. 14, illustrating a modification of the supervisory unit.

Any of the aforedescribed variants of the circuitry of position sensor 1 can be used in combination with a supervisory unit 3 as shown in FIG. 14 or 15. According to FIG. 14, this unit comprises an input stage with an inverting amplifier receiving the useful signal C from the position sensor via line 6 and terminal 27 (cf. FIG. 1) to provide a pulse-modulated signal D of complementary configuration. Amplifier 26 is followed by a differentiation network 61 deriving a set of negative spikes E, as shown in the correspondingly labeled graph of FIG. 16, from the negative-going pulse flanks of signal D. The showing of signals A and B in the first two graphs of FIG. 16 is based on the assumption that the associated position sensor has the circuitry of FIG. 5 as modified in accordance with FIG. 6, a combination illustrated in FIG. 18 discussed hereinafter, to operate according to the mode of FIG. 3. It will be noted that the spikes E, whether derived from negative modulating pulses b̄ or from positive modulating pulses b of the inverted signal D, always have the same magnitude and recurrence period. An integrating network 30, which together with an inverting amplifier 31 forms part of the pulse extractor 29 schematically illustrated in FIG. 1, generates a rippling negative voltage F which the limiting amplifier 31 translates into a steady positive voltage G serving as an enabling signal.

The switchover circuit 33 of unit 3, also shown schematically in FIG. 1, comprises an integrating network 62 receiving the pulse train D from the output of amplifier 26. Network 62, contrary to network 30 of pulse extractor 29 responding only to negative spikes E, has a uniform time constant for the charging and the discharging of its shunt capacitor to produce a signal H with symmetrical ripple voltages in the presence of negative and positive pulse sequences of signal D. An inverting amplifier 63 of limiting type, similar to amplifier 31, converts these ripple voltages into the two-level load-control signal J referred to in connection with FIGS. 6 and 7.

The load-actuating relay 34 is shown in FIG. 14 to have an operating circuit including an NPN transistor 32 whose base is connected to a tap of a voltage divider 64 which extends, in parallel with that operating circuit, across the positive and negative supply conductors of the system. Another tap of that divider is connected to the outputs of amplifiers 31 and 63 via respective diodes 65 and 66 which effectively short-circuit the base/emitter path of transistor 32 unless signals G and J are both sufficiently positive to render that transistor conductive, thereby operating the relay 34. It will thus be apparent that relay 34 is energized only when the useful signal C is at its high basic level $V_2$ and is modulated by an uninterrupted series of checking pulses $\overline{b}$. Signal J is transmitted to the control terminal 24 of FIGS. 6 and 7 from a point upstream of diode 66.

The circuitry of supervisory unit 3 shown in FIG. 15 differs from that of FIG. 14 only by the interposition of an Ex-OR gate 35 between amplifier 26 and switchover circuit 33. Gate 35, receiving the pulsed signal D on one input, has its other input connected to the output terminal 19 of clock 18 whose timing pulses coincide with pulses aa and $\overline{ab}$ of signals A and B as explained with reference to FIG. 6. This results in a virtually ripple-free signal H'—even if integrating network 62 were omitted—at the input of amplifier 63 as seen in the corresponding graph of FIG. 17 which otherwise conforms to FIG. 16. The magnitude of the load-control signal J will therefore vary in accordance with the basic voltage levels $V_1$ and $V_2$ of signal C, regardless of the depth of modulation by checking pulses b and $\overline{b}$.

Figure 18:
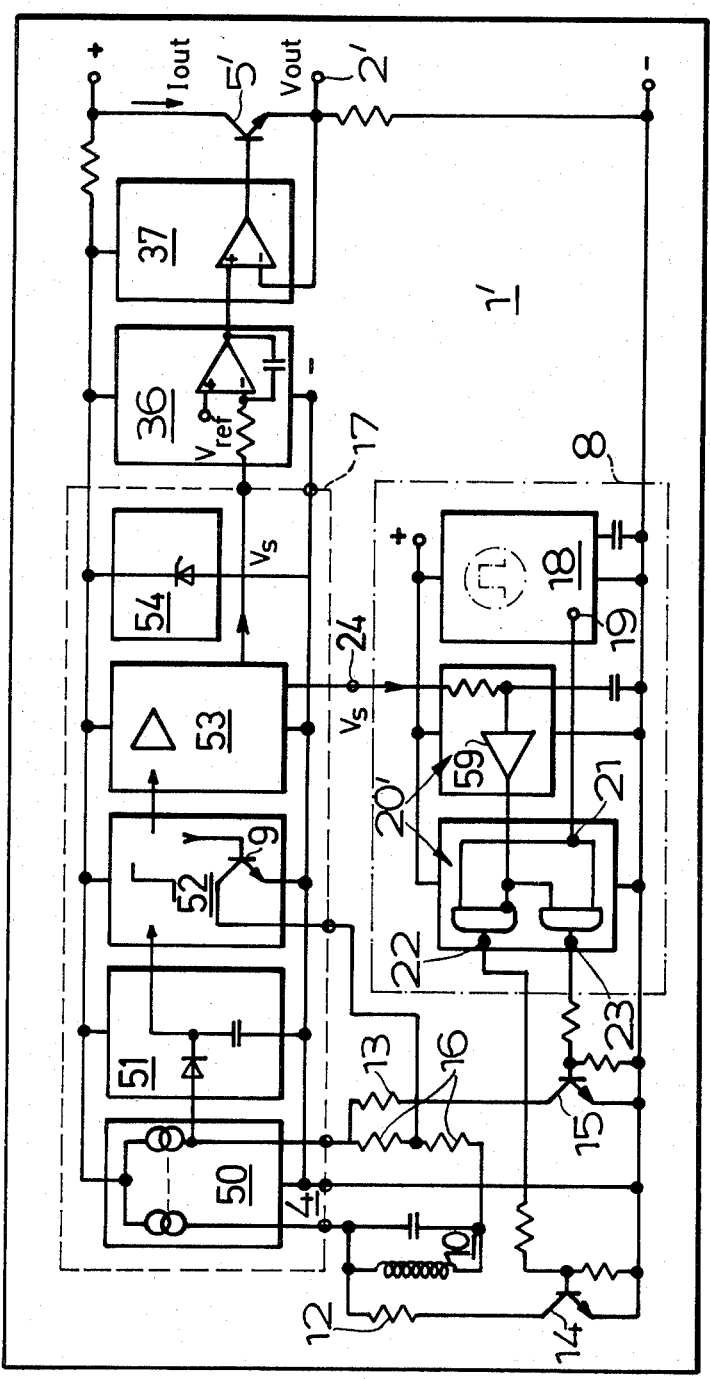
FIG. 18 is a diagram similar to that of FIG. 5, showing a modified position sensor.

In FIG. 18, already referred to, we have shown a modified position sensor 1' with two further stages interposed between component 17 and an output switch here represented by an NPN transistor 5', namely an integrating operational amplifier 36 and another amplifier 37 designed as a voltage/current converter. With the width of checking pulses b, $\overline{b}$ assumed to equal a third of their recurrence period, the output voltage of integrating stage 36 will—ideally—equal one third or two thirds of a reference voltage $V_{ref}$, applied to the noninverting input of the operational amplifier, if its inverting input receives from variable-impedance network 53 a pulse-modulated signal voltage $V_s$ similar to that shown in the left-hand half and in the right-hand half, respectively, of graph D (FIG. 16), assuming that voltage $V_{ref}$ corresponds to the peak of this signal voltage. The output voltage is translated by converter 37 into a proportional current $I_{out}$ which drives the transistor 5' and results in the appearance of a corresponding voltage $V_{out}$ on the output terminal 2' of unit 1'.

Let us assume, by way of example, that voltage $V_{ref}$ has a magnitude causing the flow of a current $I_{out}$ of 20 mA through transistor 5' if signal $V_s$ is entirely absent; this lies within an order of magnitude conventionally used in signal transmission. If, now, voltage $V_{out}$ has a value corresponding to a current of less than 4 mA, signal $V_s$ is abnormally high in conformity with the left-hand half of graph D when lacking the modulating pulses $\overline{b}$. An output voltage corresponding to a current in a range of 4 to 9.2 mA could be regarded as normal for the externally undamped oscillator operating properly, while a range of 10.6 to 15.8 mA could be assigned to proper operation with external damping. When the output current exceeds 16 mA, signal $V_s$ will be considered abnormally low in conformity with the right-hand half of graph D in the absence of modulating pulses b.

Figure 19:
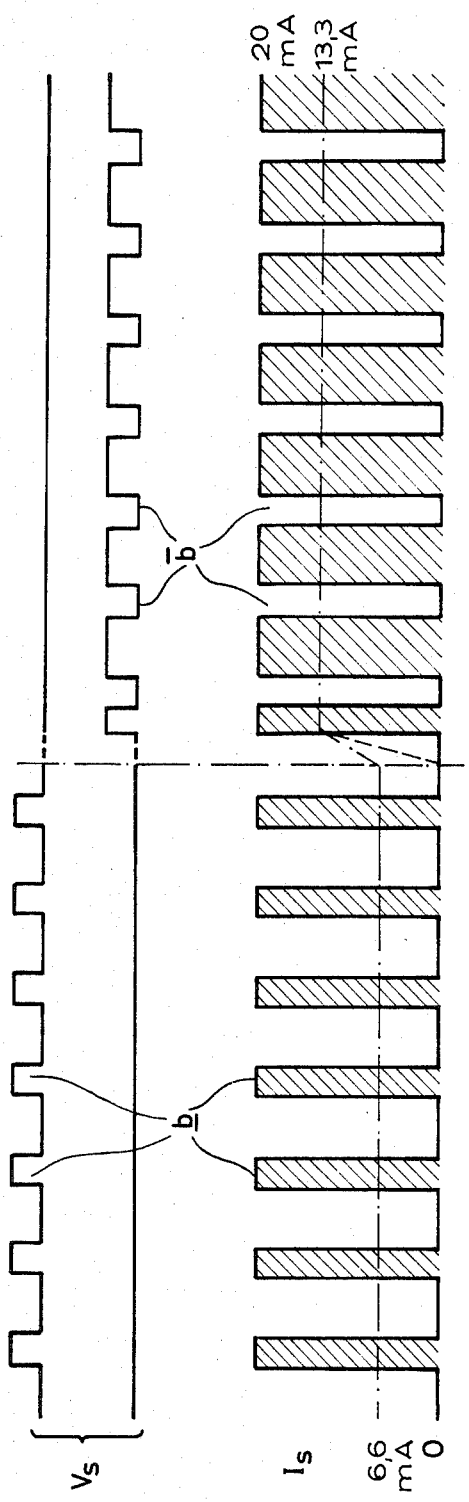
FIG. 19 is a set of graphs pertaining to the mode of operation of the position sensor of FIG. 18.

This mode of operation has been illustrated in FIG. 19 whose two top graphs show the signal voltage $V_s$ at low level with modulating pulses b and at high level with modulating pulses $\overline{b}$, respectively; the bottom graph represents a corresponding, hypothetical signal current $I_s$ which would come into existence if no voltage integration took place in stage 36 of FIG. 18, ranging in value between 0 and 20 mA. In its left-hand half, pertaining to externally undamped oscillations, the mean magnitude of this current has the theoretical value of 6.6 mA; in its right-hand half, where external damping is assumed, that mean magnitude has the distinctly different value of 13.3 mA. The absence of pulses b and $\overline{b}$ would change these values to 0 and 20 mA, respectively.

Figure 20:
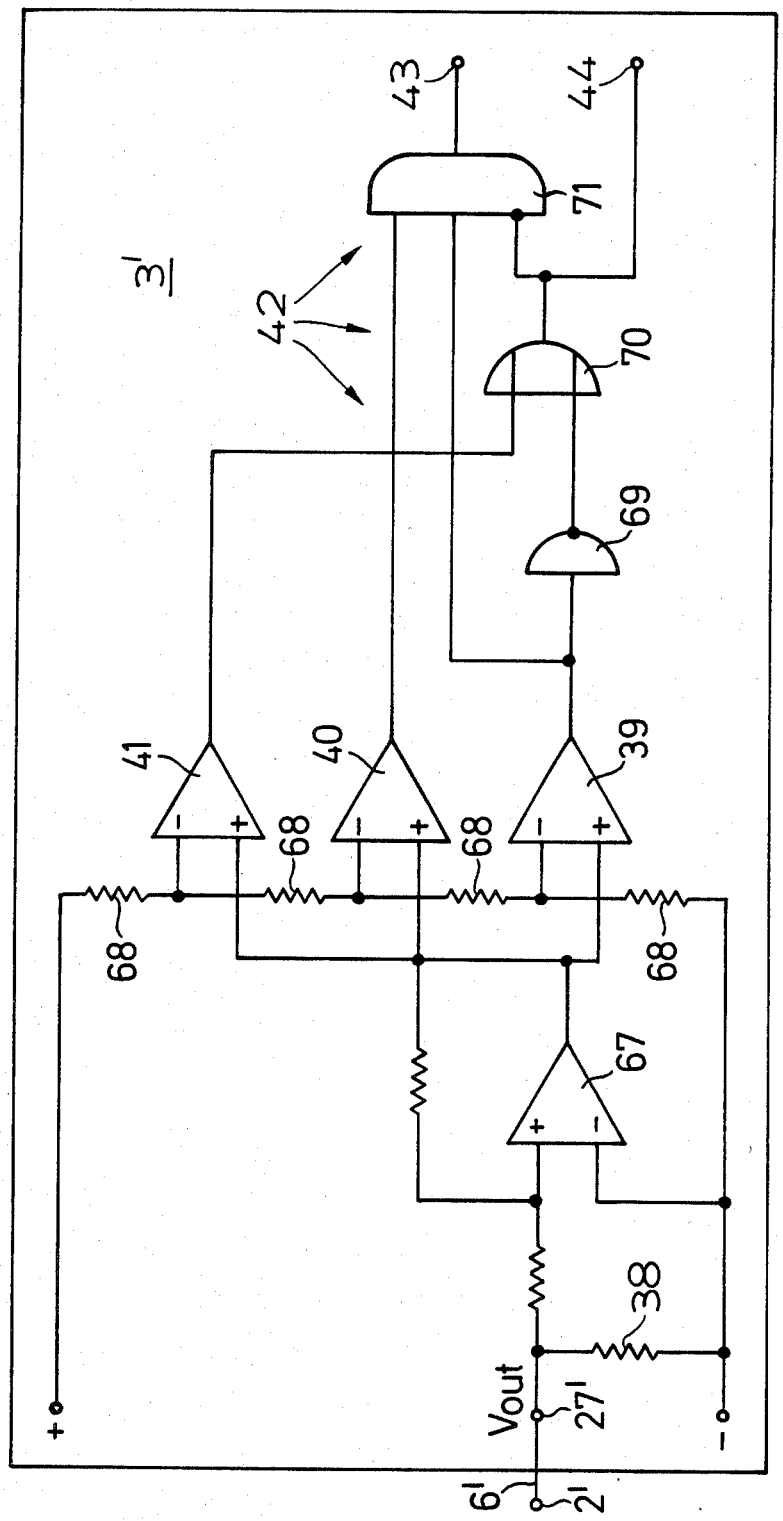
FIG. 20 is a circuit diagram showing a level discriminator usable with the position sensor of FIG. 18.

A discriminator designed to distinguish among the critical ranges referred to, taking the place of the supervisory unit 3 of FIGS. 1, 14 and 15, has been illustrated at 3' in FIG. 20. This discriminator has an input terminal 27', connected via a line 6' to output terminal 2' of unit 1' shown in FIG. 18, working into a noninverting input of an operational amplifier 67 whose inverting input is tied to the negative supply conductor. Voltage $V_{out}$ is developed across an input resistor 38 and is applied by amplifier 67 to noninverting inputs of three comparators 39, 40 and 41 whose inverting inputs receive respective threshold voltages from a potentiometer 68. A logic circuit 42 comprises an inverter 69 connected to the output of comparator 39, an OR gate 70 with inputs connected to the outputs of inverter 69 and comparator 41, and an AND gate 71 with an inverting input tied to the output of OR gate 70 and with noninverting inputs connected to the outputs of comparators 39 and 40. AND gate 71 has an output 43 emitting a load-control signal, e.g. to the base of a transistor 32 in series with a relay 34 as shown in FIGS. 14 and 15, while an output terminal 44 also connected to the output of OR gate 70 generates an alarm signal when that gate conducts in the presence of an abnormally low or an abnormally high voltage $V_{out}$ detected by comparator 39 or 41. Terminal 44 may be connected to a signal lamp, such as that shown at 7 in FIG. 1, and/or may serve for the operation of a switch inhibiting the actuation of the load.

Since OR gate 70 will conduct only when modulating pulses b or $\overline{b}$ are absent, as explained above, that gate may be regarded as a pulse-responsive means functionally equivalent to the pulse extractor 29 of FIGS. 1, 14 and 15.

In FIG. 18 the control input of test-pulse generator 8' is shown connected, to an output of variable-impedance network 53 emitting an inverted signal voltage $\overline{V_s}$ which will be similar to that shown in graph C of FIG. 16. Since converter 20' includes an integrating network at the input of its amplifier 59, the modulating pulses of voltage $V_s$—whose duty ratio should be well below 50%, as assumed above—will be largely suppressed so that this generator will operate essentially in the same manner as when controlled by the output signal J of switchover circuit 33 as heretofore described. This mode of connection, therefore, would also be proper for a system including the supervisory unit 3 of FIG. 14 or 15.

We claim:

1. In an electronic monitoring system including a detector sensitive to an ambient condition for generating on an output thereof a useful signal assuming either of two levels in dependence upon the ambient condition being monitored, the combination therewith of:
- a source of periodically recurrent test pulses connected to a control input of said detector for giving rise to a corresponding train of checking pulses superimposed upon said useful signal on at least one of said levels thereof; and
- supervisory means coupled to said output for deriving from said useful signal a load-control signal purged from said checking pulses, said supervisory means including pulse-responsive means for emitting an alarm indication upon sensing a malfunction-induced interruption of said train of checking pulses in the presence of said one of said levels.

2. The combination defined in claim 1 wherein said supervisory means further comprises switchover means for respectively establishing a first and a second operational mode in response to said one of said levels and the other of said levels of said useful signal, said pulse-responsive means being connected to said switchover means for preventing the establishment of said first operational mode upon interruption of said train of checking pulses.

3. The combination defined in claim 2 wherein said source has an input coupled to the output of said detector for changing the character of said test pulses in dependence upon the level of said useful signal to produce amplitude-increasing checking pulses in the presence of the lower one of said levels and amplitude-reducing checking pulses in the presence of the higher one of said levels.

4. The combination defined in claim 3 wherein said supervisory means further includes integrating circuitry inserted between said detector and said switchover means for converting said useful signal into said load-control signal in accordance with the mean amplitude of said useful signal as modified by said checking pulses, the amplitudes and recurrence rates of said checking pulses being low enough to maintain said mean amplitude at distinct values for said lower and higher levels.

5. The combination defined in claim 3 wherein said pulse-responsive means comprises a differentiation stage, deriving spikes of like polarity from both amplitude-increasing and amplitude-reducing checking pulses, and an integrating stage converting said spikes into an enabling signal permitting a response of said switchover means to said load-control signal.

6. The combination defined in claim 3 wherein said supervisory means further comprise an Exclusive-OR gate upstream of said switchover means with one input connected to the output of said detector and with another input connected to said source for substantially suppressing said checking pulses in the useful signal.

7. The combination defined in claim 1 wherein said pulse-responsive means includes threshold circuitry discriminating among an abnormally low mean value, a normally low mean value, a normally high mean value and an abnormally high mean value of said useful signal, said alarm indication being generated by said threshold circuitry in response to said abnormally low and said abnormally high mean value.

8. The combination defined in claim 1 wherein said detector comprises an oscillator with a tank circuit tuned to an operating frequency substantially higher than the recurrence rate of said test pulses.

9. The combination defined in claim 8 wherein said test pulses have a recurrence period substantially greater than twice their width.

10. The combination defined in claim 8 wherein said oscillator is provided with switch means controlled by said test pulses for varying the Q of said tank circuit.

11. The combination defined in claim 10 wherein said tank circuit is provided with resistance means selectively insertable by said switch means for creating a variable damping factor.

* * * * *